US006446015B1

(12) United States Patent
Duke

(10) Patent No.: US 6,446,015 B1
(45) Date of Patent: Sep. 3, 2002

(54) METHOD AND APPARATUS FOR FLIGHT DATA ACQUISITION USING AN OPTIMIZED MULTIPLE FREQUENCY WAVEFORM

(75) Inventor: Bryan D. Duke, Sweeny, TX (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/511,583

(22) Filed: Feb. 23, 2000

(51) Int. Cl.[7] .............................................. G01R 13/00

(52) U.S. Cl. ............................ 702/66; 702/67; 702/70; 702/124; 702/189; 702/190; 244/75 R; 244/76 R; 324/76.12; 324/76.19; 701/11; 701/14

(58) Field of Search ............................... 702/66, 70–72, 702/74–76, 189, 124, 126, 190, 196, 199; 434/31, 35, 66, 242; 342/165, 169, 173; 701/13, 14, 120, 122; 324/76.15, 76.19, 76.21, 76.27; 375/224, 208, 260

(56) References Cited

U.S. PATENT DOCUMENTS 5,260,874 A * 11/1993 Berner et al. ................. 701/33
5,375,065 A * 12/1994 Owen ......................... 702/124
5,515,300 A * 5/1996 Pierce ........................ 702/190
6,208,946 B1 * 3/2001 Arakawa et al. .............. 702/77

* cited by examiner

*Primary Examiner*—Marc S. Hoff
*Assistant Examiner*—Sam H. Choi
(74) *Attorney, Agent, or Firm*—John H. Kusmiss

(57) ABSTRACT

The present invention comprises a method and apparatus that generates a waveform consisting of an arbitrary number of frequency sweeps combined from adding and subtracting mini frequency sweeps. Optimization routines determine the best combination order of frequency sweep to minimize or maximize design criteria such as aerodynamic surface deflection or maximum command rate of the wave form. The invention allows for arbitrary output timing, or commands per second issued for the desired waveform, arbitrary starting and ending frequencies and amplitudes, arbitrary number of frequency sweep components, arbitrary frequency sweep exponent, arbitrary amplitude sweep exponent, and arbitrary waveform length. For a given frequency range and sweep exponent, amplitude range and sweep exponent, desired total waveform time and number of frequency sweep components, the algorithm can determine the optimum arrangement of the components to minimize the maximum amplitude or rate.

13 Claims, 3 Drawing Sheets

METHOD AND APPARATUS FOR FLIGHT DATA ACQUISITION USING AN OPTIMIZED MULTIPLE FREQUENCY WAVEFORM

BACKGROUND OF THE INVENTION

1. Field of the Invention

The present invention relates generally to the field of avionics, and more particularly to a method for acquiring in situ flight data for variable flight conditions and for large frequency ranges with a reduced flight data acquisition period. That is, a range of frequency conditions are compressed such that multiple conditions can be evaluated simultaneously, reducing the time that the pilots are exposed to flight conditions on the envelope of the plane's operable capability.

2. Description of Related Art

Most modern tactical aircraft are designed to be aerodynamically unstable, or at least marginally stable during flight. Two examples of unstable aircraft are the F-117 and the F-16. For these types of aircraft, it is critical to know the exact transfer function of the forces generated by the thrust system for a wide range of flight conditions. The historic method for generating the transfer function is known as a "frequency sweep." A frequency sweep is a series of in situ maneuvers made by a pilot in an aircraft while flight data is recorded. For example, the F-15 ACTIVE was a fly-by-wire controlled aircraft with an experimental thrust vectoring system. Large movable or variable geometry nozzles were used to vector the engine thrust in a given direction. Once it was determined that the plane could be redirected by moving the nozzles, the next step was to map the response of the plane to various "stick" maneuvers. Here, the "stick" refers to the controls for the nozzles as the nozzles are moved back and forth.

The nozzles have a mechanical limitation as to how quickly the nozzles can be rotated—in the present example the nozzle was limited to a maximum angular rate change of 80 degrees per second. Thus, if an eight degree change was called for, the shortest time required for this change was one tenth of a second. To generate a frequency sweep, the pilot would climb the aircraft to its designated flying altitude and level off, and turn on the flight data recording instruments. The pilot would then manually move the stick in a sinusoidal manner, starting by pushing the stick incrementally forward slowly and then back. The pilot would repeat the stick movements, gradually increasing in speed as the plane responded to the various control inputs. This process is continued until either the maximum gimbal rate is achieved, or until the aircraft response can longer keep up with the flight control inputs. The latter condition is indicative that the input frequency is higher than the maximum frequency that the aircraft can respond to. This entire process may take as long as sixty to ninety seconds or more, depending on the various flight conditions. In evaluating the performance characteristics of the aircraft, the frequency response and the maximum input frequency are critical values.

The advent of computer controlled flight relieved the pilot of the duty of manually controlling the stick maneuvers, and replaced the pilot with a computer program. In other words, a computer would be programmed to deliver the aircraft through a series of predetermined maneuvers, or waveform, and the flight data would be recorded in response to the computer controlled waveform. However, the problem still remained that a set of flight data for a given condition could require a minute or more of in situ flight frequency sweeps (sine wave with varying frequency) to obtain enough power content over the desired frequency range. Identifying transfer functions for standard aerodynamic surfaces (ailerons, rudders, etc.) was possible because these surfaces are relatively unaffected by throttle changes. Consequently, the throttles could be set to maintain flight condition and the plane would remain at a specified flight condition for as long as required. The characteristics of thrust vectoring, however, are greatly affected by throttle position. Thus, to obtain a complete transfer function map of the thrust vectoring used for the particular application, tests at many power settings from idle to maximum thrust were necessary. The further deviations from level flight throttle setting caused the aircraft to accelerate and thereby escape from the desired flight condition. For tests at extremes from the level flight condition, the sixty seconds or more of flight data was unacceptably long. There existed a need to obtain a flight response to variable conditions in a shortened time, conserving flight times and provide more data efficiently in as little in situ flight time as possible.

OBJECTS AND SUMMARY OF THE INVENTION

In order to obtain the desired flight test data, a method had to be derived to command the thrust vectoring with as much frequency content as possible in as short a period as possibly while operating within the mechanical constraints of the aircraft nozzle. In place was a programmable test input (PTI) system which was used to command open-loop surface excitations on the F-15 ACTIVE. This system allowed predetermined sequences of up to five sine or piece-wise-linear waveforms to be calculated real-time and commanded to any aircraft control effector during single command sequence. The sine waveforms could vary frequency over time to perform frequency sweeps. The five waveforms are referred to as a "dataset." However, the PTI system provided for only one dataset to be executed at a time.

The present invention includes an algorithm that generates a waveform consisting of an arbitrary number of frequency sweeps combined from adding and subtracting obtained frequency sweeps. Optimization routines determine the best combination order of frequency sweeps to minimize the maximum deflection or maximum command rate of the wave form. The algorithm allows for arbitrary output timing, or commands per second issued for the desired waveform, arbitrary starting and ending frequencies and amplitudes, arbitrary number of frequency sweep components, arbitrary frequency sweep exponent, arbitrary amplitude sweep exponent, and arbitrary waveform length.

For a given frequency range and sweep exponent, amplitude range and sweep exponent, desired total waveform time an number of frequency sweep components, the algorithm can determine the optimum arrangement of the components to minimize the maximum amplitude or rate. Using the above input information, the starting and ending frequencies and amplitudes are calculated for each frequency sweep component (stack) along with the amplitude and frequency sweep exponents. Each stack is then calculated and stored in a matrix. Once all stacks are calculated, all combinations of adding and subtracting the stacks are performed. The maximum amplitude and rate are recorded in a vector for each combination. Once all combinations are calculated, the frequency and amplitude ranges and sweep exponents for the final waveform are provided as output. The final waveform is recalculated and also provided as output.

BRIEF DESCRIPTION OF THE DRAWINGS

The exact nature of this invention, as well as its objects and advantages, will become readily apparent upon reference to the following detailed description when considered in conjunction with the accompanying drawings, in which like reference numerals designate like parts throughout the figures thereof, and wherein.

DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein specifically to provide a method and apparatus for flight data acquisition using an optimized multiple frequency waveform.

Figure 1:
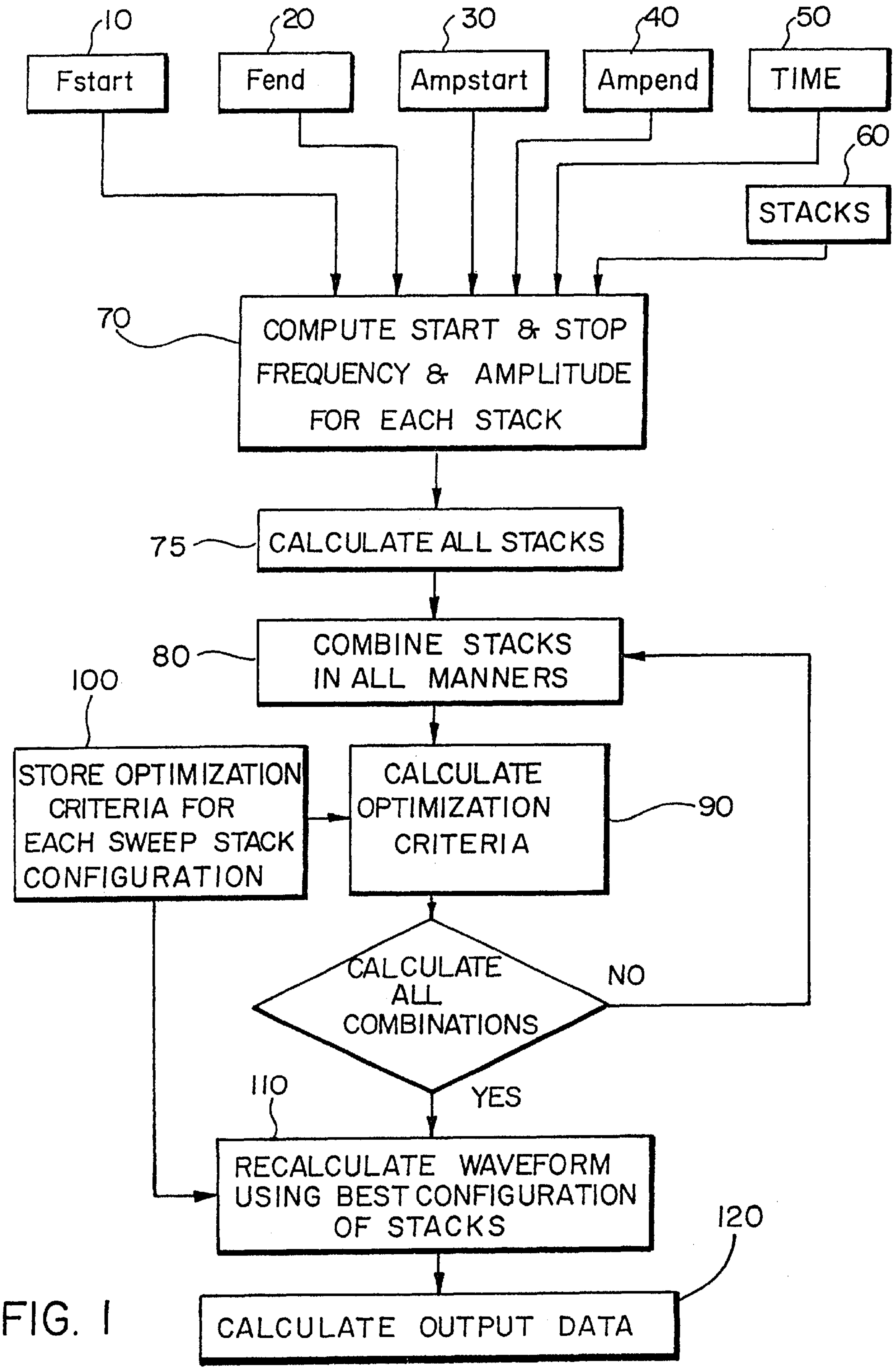
FIG. 1 is a block diagram of the process of the present invention.

Referring to FIG. 1, which is a block diagram of the algorithm used in the present invention the initial inputs are the starting and ending frequencies and amplitudes for the desired frequency sweep, as well as the total waveform time and the number of discrete waveforms or stacks in the desired sweepstack output waveform. These inputs are designated Fstart, Fend, Ampstart, Ampend, "Time", and "Stacks" respectively, corresponding to boxes 10, 20, 30, 40, 50 and 60. From these inputs the starting and ending frequencies for each stack are computed as well as the amplitudes in step 70. A subroutine then computes each stack (step 75), shown graphically in FIG. 2 as 210*a–d* and stores the computed stacks in a frequency array and an amplitude array. Note that while four stacks are shown in FIG. 2, the invention can be expanded to accommodate the number of stacks desired for the particular application.

The invention then takes the stacks and combines the stacks in every possible combination of adding and subtracting each set of stacks (step 80), and determines the desired flight characteristic maximum and minimum condition (step 90). For example, the maximum surface deflection (or waveform output) and the maximum rate (i.e. the maximum derivative of the waveform) could be calculated for each combination. These inputs are important when evaluating thrust vectoring where the movement of the surfaces were mechanically limited. Other optimizing criteria is also used and can be easily interchanged depending on the desired flight parameters. For each combination, the optimized criteria are stored for later evaluation (step 100).

Using the optimized criteria for each sweepstack configuration, the combination which meets the optimization criteria the best is identified and used to recalculate that waveform (step 110) and the output data is calculated. The output data could comprise the composite waveform, the frequency and amplitude start and stop for each stack, the maximum and minimum waveform peak, the maximum rate, and the power spectral density for the composite sweepstack.

Figure 2:
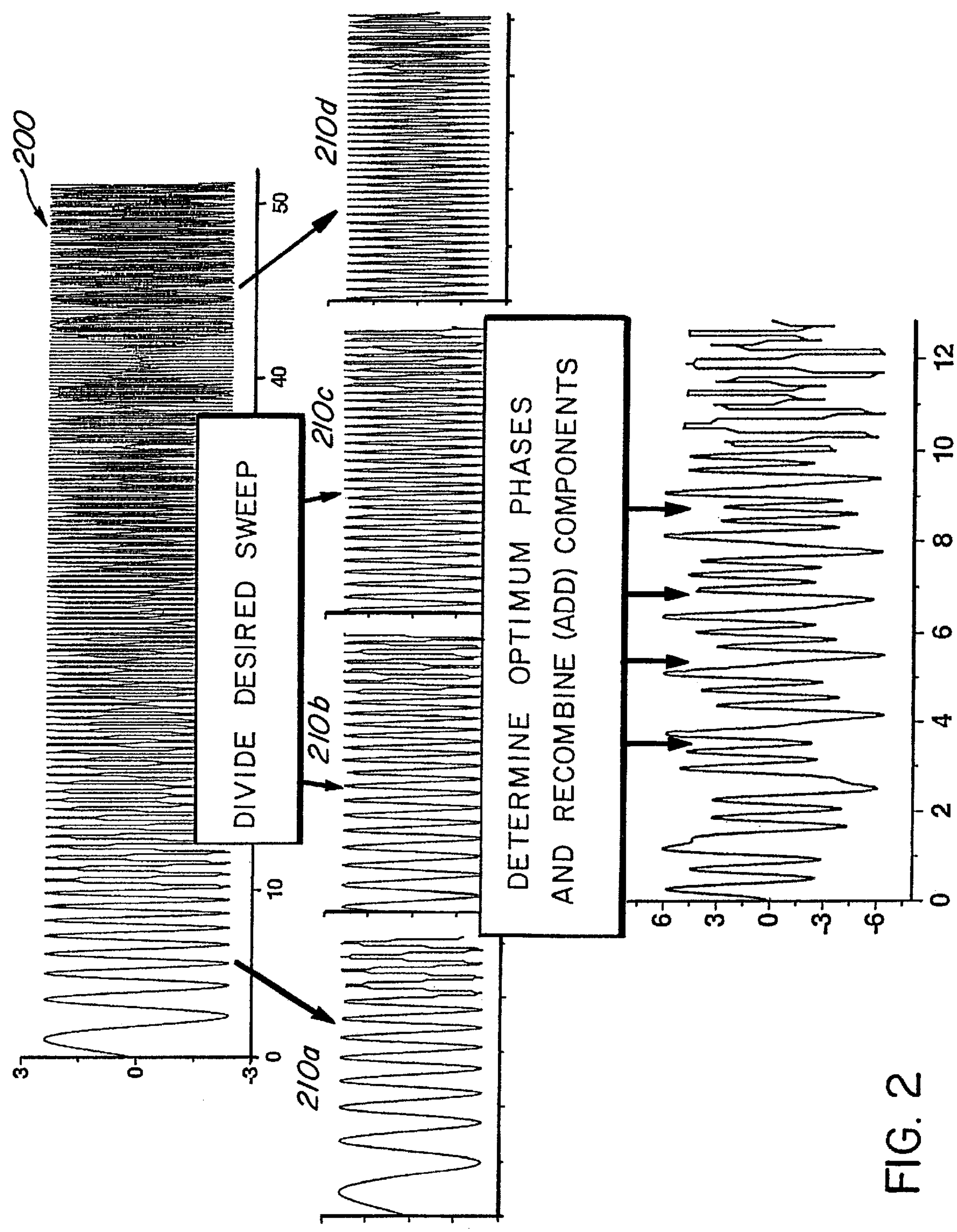
FIG. 2 is a series of graphs showing a progression from a frequency range to discrete stacks to an optimized stack.

FIG. 2 illustrates graphically the process of one embodiment of the present invention. A frequency sweep 200 is divided into a series of stacks 210*a–d,* which in turn are combined in every combination to yield an optimized composite frequency sweep with a duration of only one-fourth the duration of the original frequency sweep, but with the same amount of critical data as the original frequency sweep.

Figure 3:
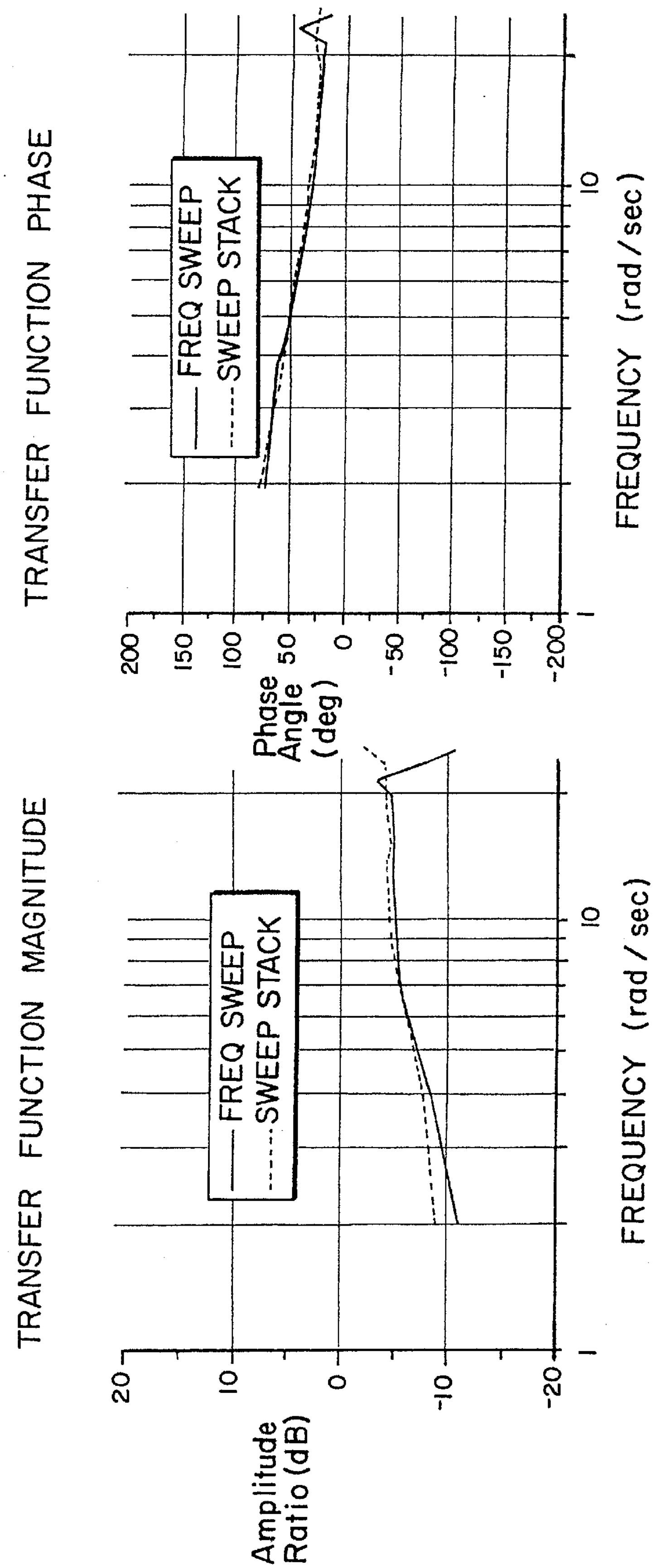
FIG. 3 is an example of a comparison between a frequency sweep and an optimized approach using the present invention.

The invention was tested on flight tests on the F-15 ACTIVE and in simulation, and both simulation and flight data yielded similar and favorable results. A standard frequency sweep was compared with two different sweepstack waveforms. Sweepstack A used four frequency sweep components each with the same amplitude and one-fourth the duration of the original frequency sweep. Sweepstack B used four frequency sweep components each with the same amplitude and one half the duration of the original frequency sweep. Once optimized for minimum amplitude, each sweepstack had a maximum amplitude of approximately twice the original frequency sweep and a maximum rate of approximately ten percent greater than the original frequency sweep. Moreover, flight tests and simulation yielded nearly identical input and output power spectral densities, and transfer functions for the original frequency sweep and Sweepstack A. Tests showed Sweepstack B to have considerably more input and output power than the original frequency sweep and a smoother transfer function, as would be expected. The comparison of the original frequency sweep with that of Sweepstack A are shown graphically in FIG. 3.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A method for reducing the amount of time to obtain flight data for a frequency sweep comprising the steps of:

a) generating a given frequency sweep for a given flight condition;

b) dividing the frequency sweep into a discrete number of frequency stacks;

c) combining the discrete frequency stacks in a plurality of manners;

d) selecting an optimized waveform from the combinations of discrete frequency stacks, where said optimized waveform is of a shorter duration than said frequency sweep; and e) outputting a selected criteria based on said optimized waveform.

2. The method for reducing the amount of time to obtain flight data in claim 1 wherein the step of combining the discrete frequency stacks comprises adding the stacks in every possible combination, and subtracting the stacks in every possible combination.

3. The method for reducing the amount of time to obtain flight data as recited in claim 1 further comprising the step of in putting frequency and amplitude ranges and exponents for the frequency sweep.

4. The method for reducing the amount of time to obtain flight data as recited in claim 1 further comprising the step of selecting the number of discrete frequency stacks to be generated.

5. The method for reducing the amount of time to obtain flight data as recited in claim 1 wherein the step of selecting an optimized waveform is dependent upon a maximum rate of the optimized waveform.

6. The method for reducing the amount of time to obtain flight data as recited in claim 1 wherein the step of selecting an optimized waveform is dependent upon a maximum amplitude of the optimized waveform.

7. The method for reducing the amount of time to obtain flight data as recited in claim 1 wherein the step of selecting an optimized waveform is dependent upon a maximum surface deflection of the optimized waveform.

8. A computer for generating an optimized waveform from a given frequency sweep, where said computer comprises:

input means to determine a number of frequency stacks to be generated from said given frequency sweep;

means for generating said number of frequency stacks from said given frequency sweep;

means for combining the frequency stacks in a plurality of ways for the purpose of generating an optimized waveform from among the combinations of plurality of ways for combining the frequency stacks;

means for selecting an optimized waveform based on a predetermined criteria, where said optimized waveform is of a shorter duration than said given frequency sweep; and means for outputting said optimized waveform.

9. The computer for generating an optimized waveform in claim 8 wherein the means for combining the frequency stacks comprises adding the stacks in every possible combination, and subtracting the stacks in every possible combination.

10. The computer for generating an optimized waveform in claim 8 further comprising means for inputting frequency and amplitude ranges and exponents for the frequency sweep.

11. The computer for generating an optimized waveform in claim 8 wherein the means for selecting an optimized waveform is dependent upon a maximum rate of the optimized waveform.

12. The computer for generating an optimized waveform in claim 8 wherein the means for selecting an optimized waveform is dependent upon a maximum amplitude of the optimized waveform.

13. The computer for generating an optimized waveform in claim 8 wherein the means for selecting an optimized waveform is dependent upon a maximum surface deflection of the optimized waveform.

* * * * *